US012727184B2

(12) United States Patent
Hauf et al.

(10) Patent No.: US 12,727,184 B2
(45) Date of Patent: Sep. 1, 2026

(54) SEMICONDUCTOR DEVICE INCLUDING PROTRUDING REGION

(71) Applicant: Infineon Technologies AG, Neubiberg (DE)

(72) Inventors: Moritz Hauf, Munich (DE); Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 691 days.

(21) Appl. No.: 17/837,590

(22) Filed: Jun. 10, 2022

(65) Prior Publication Data

US 2022/0406922 A1 Dec. 22, 2022

(30) Foreign Application Priority Data

Jun. 21, 2021 (DE) ......................... 102021115946.6

(51) Int. Cl.
*H10D 12/00* (2025.01)
*H10D 8/20* (2025.01)
(Continued)

(52) U.S. Cl.
CPC ............ *H10D 12/481* (2025.01); *H10D 8/20* (2025.01); *H10D 62/102* (2025.01);
(Continued)

(58) Field of Classification Search
CPC .. H10D 12/481; H10D 62/127; H10D 62/142; H10D 62/364; H10D 30/0275;
(Continued)

(56) References Cited

U.S. PATENT DOCUMENTS 5,162,876 A 11/1992 Kitagawa et al.
6,096,625 A * 8/2000 Daniel ................ H01L 21/3225 257/E21.321
(Continued)

FOREIGN PATENT DOCUMENTS

DE 102004035788 A1 3/2005
DE 102014118664 A1 6/2016
DE 112019000096 T5 8/2020

*Primary Examiner* — William B Partridge
*Assistant Examiner* — Alexandre X Ramirez
(74) *Attorney, Agent, or Firm* — Murphy, Bilak & Homiller, PLLC

(57) ABSTRACT

A semiconductor device includes: a drift region of a first conductivity type arranged between first and second surfaces of a semiconductor body; a first region of the first conductivity type at the second surface; a second region of a second conductivity type arranged adjacent to the first region at the second surface, the second region including first and second sub-regions, the second sub-region arranged between the first sub-region and the second surface; and a first electrode on the second surface and arranged directly adjacent to the first region and the second sub-region. The first electrode is electrically connected to the drift region by the first region. The first sub-region protrudes, along a first lateral direction, over an interface or a separation region between the second sub-region and the first region. A part of the first region is confined by the first sub-region and the first electrode along a vertical direction.

23 Claims, 6 Drawing Sheets

(51) Int. Cl.
*H10D 62/10* (2025.01)
*H10D 64/62* (2025.01)
*H10P 30/20* (2026.01)

(52) U.S. Cl.
CPC ......... *H10D 62/106* (2025.01); *H10D 62/127* (2025.01); *H10D 64/62* (2025.01); *H10P 30/204* (2026.01); *H10P 30/21* (2026.01)

(58) Field of Classification Search
CPC ............. H10D 30/6757; H10D 84/611; H10D 62/124; H10D 62/10; H10D 12/491; H10D 8/20–25; H10D 12/032–038; H10D 12/441–461; H10D 62/106; H01L 21/26513; A23B 2/28; H10H 20/835; H02K 15/0432; H02K 15/38; H10F 39/186
See application file for complete search history.

(56) References Cited

U.S. PATENT DOCUMENTS

| | | | | |
|---|---|---|---|---|
| 11,393,812 | B2 * | 7/2022 | Kamimura | H10D 8/045 |
| 11,476,249 | B2 * | 10/2022 | Naito | H10D 84/617 |
| 2013/0264607 | A1 * | 10/2013 | Werber | H10D 62/142<br>257/E29.197 |
| 2015/0262999 | A1 * | 9/2015 | Ogura | H10D 84/403<br>257/140 |
| 2016/0211257 | A1 * | 7/2016 | Yoshida | H10D 84/811 |
| 2016/0247808 | A1 * | 8/2016 | Horiuchi | H10D 30/60 |
| 2018/0182844 | A1 * | 6/2018 | Nakamura | H10D 62/177 |
| 2020/0058779 | A1 | 2/2020 | Gejo | |
| 2020/0194429 | A1 * | 6/2020 | Naito | H10D 62/127 |

* cited by examiner

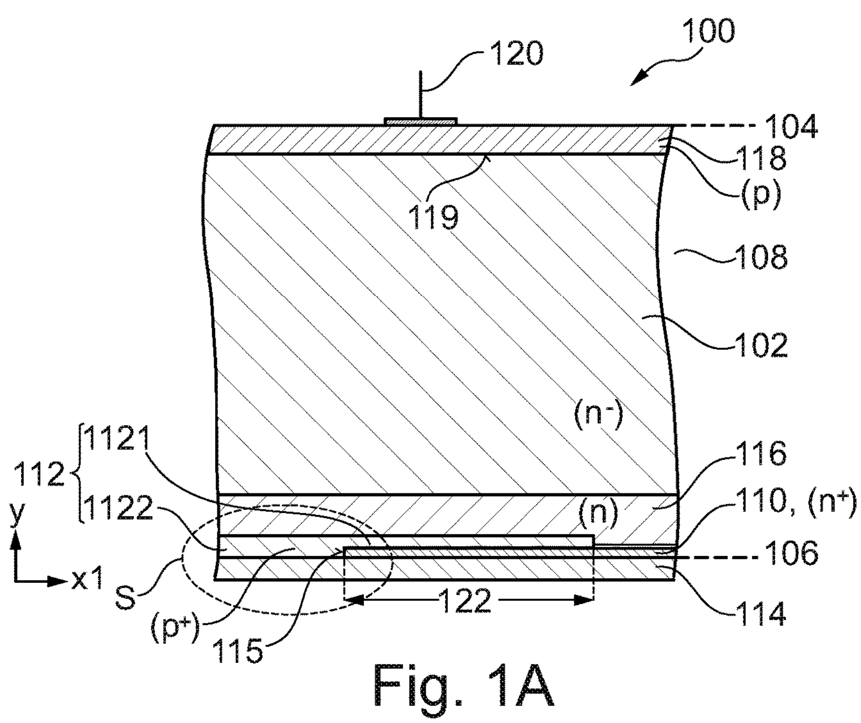
Fig. 1A
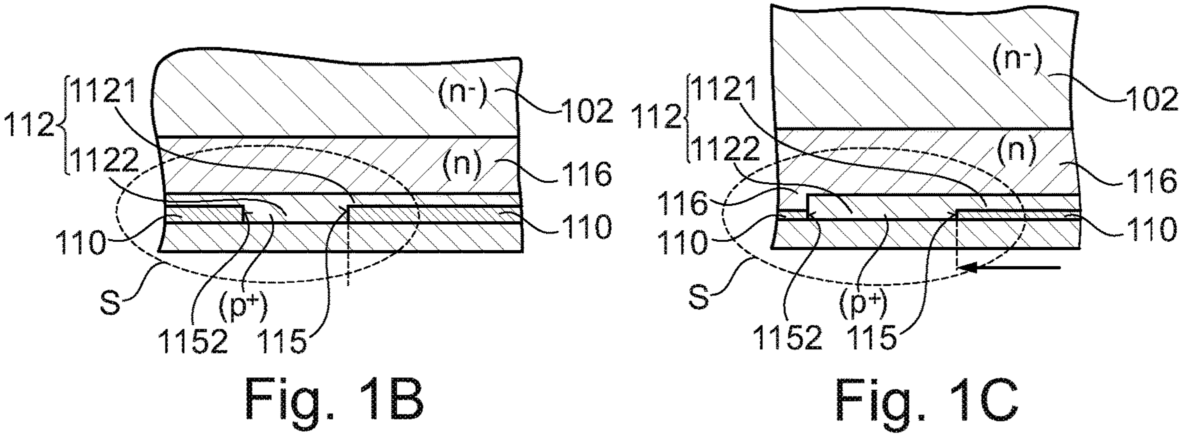
Fig. 1B
Fig. 1C
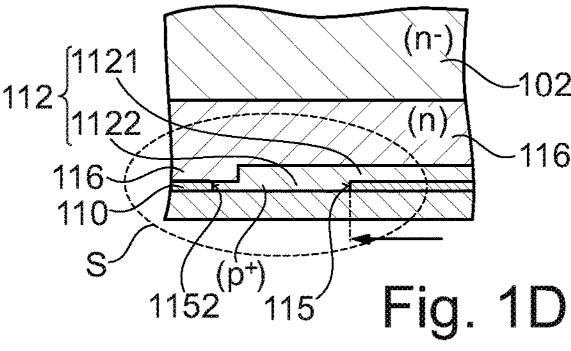
Fig. 1D

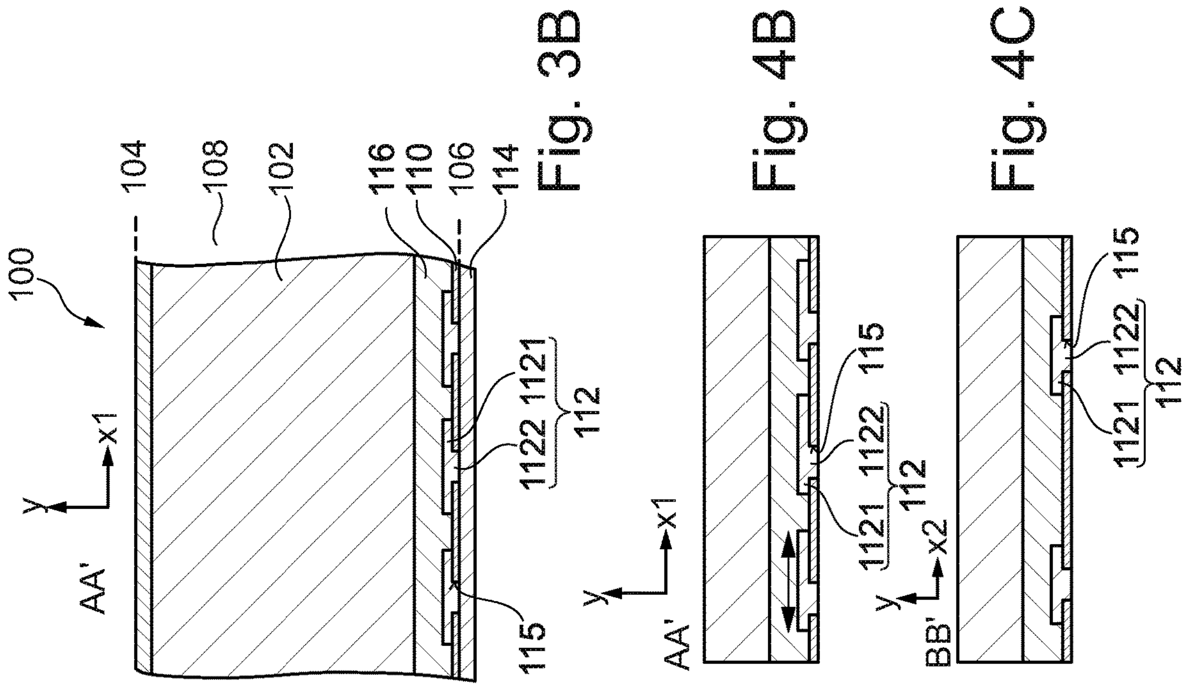
100
AA'
y
x1
104
108
102
116
110
106
114
115
1122 1121
112
Fig. 3B
AA'
y
x1
1121 1122 115
112
Fig. 4B
BB'
y
x2
1121 1122 115
112
Fig. 4C
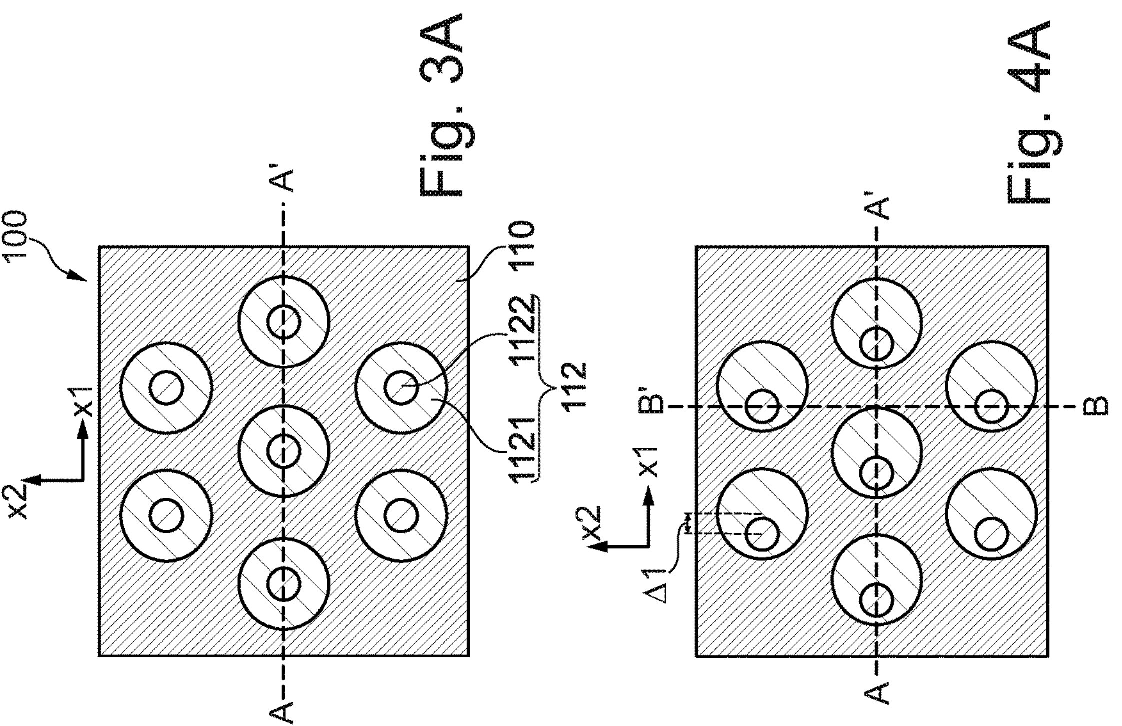
100
x2
x1
A
A'
110
1121 1122
112
Fig. 3A
x2
x1
Δ1
A
A'
B'
B
Fig. 4A 100
x1
x2
y
106
108
102
116
114
110
112
1121
1122
115
1152
124
(n⁻)
(n)
Δ2

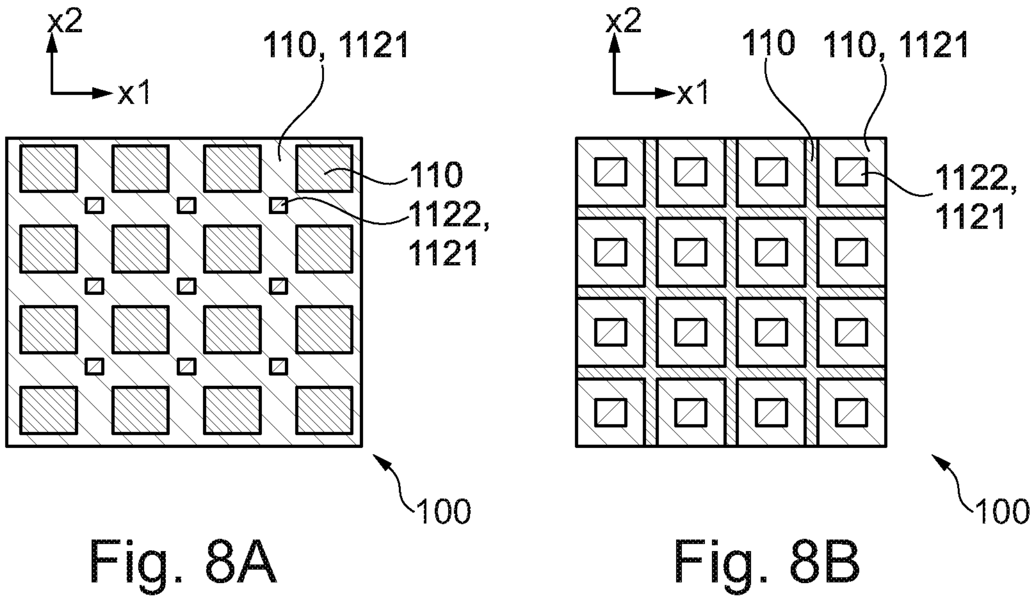
Fig. 8A
Fig. 8B
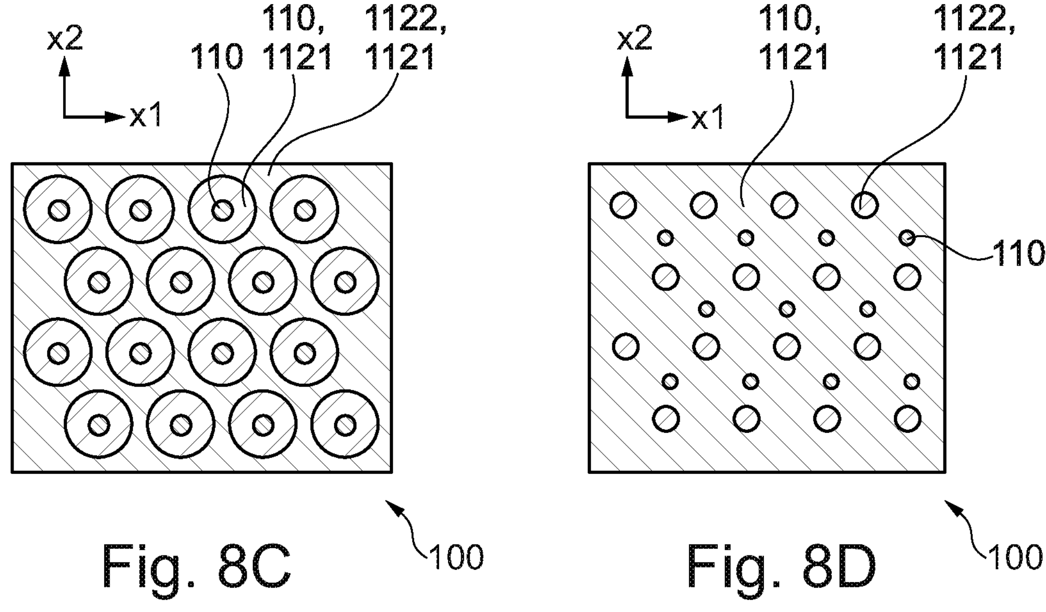
Fig. 8C
Fig. 8D

SEMICONDUCTOR DEVICE INCLUDING PROTRUDING REGION

TECHNICAL FIELD

The present disclosure is related to a semiconductor device, in particular to a semiconductor device including a protruding region.

BACKGROUND

Technology development of new generations of semiconductor devices, e.g. diodes or insulated gate field effect transistors (IGFETs) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. In silicon power diodes, a thickness reduction of the semiconductor body may be beneficial with respect to reduction of static and dynamic electric losses. Thickness reduction, however, typically comes at the cost of e.g. breakdown voltage and cosmic ray performance. Power diodes may therefore include a rather deep field stop region for providing sufficient softness during electric switching. The field stop region aims at protecting a certain amount of charge carrier plasma so that these charges can carry the load current during an end of reverse recovery, thereby avoiding a hard snap-off. This may require a certain depth and dose for the field stop region to prevent the electric field from reaching a rear part of the device, e.g. a part close to the cathode of a power diode. The field stop region may allow for increasing the maximum electric field at a given applied reverse bias voltage (at the same total chip thickness) when comparing to a diode without a field stop region or a very shallow field stop region. A higher electric field may decrease the breakdown voltage and increase cosmic ray failure in time (FIT) rate.

There may be a desire for improving a semiconductor device for enabling sufficient softness during switching without increasing the chip thickness and without sacrificing breakdown voltage or cosmic ray performance.

SUMMARY

An example of the present disclosure relates to a semiconductor device. The semiconductor device includes a drift region of a first conductivity type arranged between a first surface and a second surface of a semiconductor body. The semiconductor device further includes a first region of the first conductivity type at the second surface. The semiconductor device further includes a second region of a second conductivity type that is arranged adjacent to the first region at the second surface. The second region includes a first sub-region and a second sub-region. The second sub-region is arranged between the first sub-region and the second surface. The semiconductor device further includes a first electrode on the second surface. The first electrode is arranged directly adjacent to the first region and the second sub-region. The first electrode is electrically connected to the drift region by means of the first region. The first sub-region protrudes, along a first lateral direction, over an interface or a separation region between the second sub-region and the first region. A part of the first region is confined by the first sub-region and the first electrode along a vertical direction.

Another example of the present disclosure relates to a method of manufacturing a semiconductor device. The method includes providing a semiconductor body including a drift region of a first conductivity type arranged between a first surface and a second surface of the semiconductor body. The method further includes forming a first region of the first conductivity type at the second surface. The method further includes forming a second region of a second conductivity type that is arranged adjacent to the first region at the second surface. The second region includes a first sub-region and a second sub-region. The second sub-region is arranged between the first sub-region and the second surface. The first sub-region is arranged protruding, along a first lateral direction, over an interface or a separation region between the second sub-region and the first region. The method further includes forming a first electrode on the second surface. The first electrode is arranged directly adjacent to the first region and the second sub-region. The first electrode is electrically connected to the drift region by means of the first region. A part of the first region is confined by the first sub-region and the first electrode along a vertical direction.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

FIG. 1A is schematic cross-sectional view for illustrating an example of a semiconductor device.

FIGS. 1B, 1C, 1D are schematic cross-sectional views for illustrating different designs of a semiconductor region in a portion of FIG. 1A for tuning electric characteristics such as diode softness.

FIGS. 2A to 8D are schematic top and cross-sectional views for illustrating design variations, e.g. geometries, extents, doses, overlaps of semiconductor regions, for tuning electric characteristics such as diode softness.

DETAILED DESCRIPTION

Figure 2A:
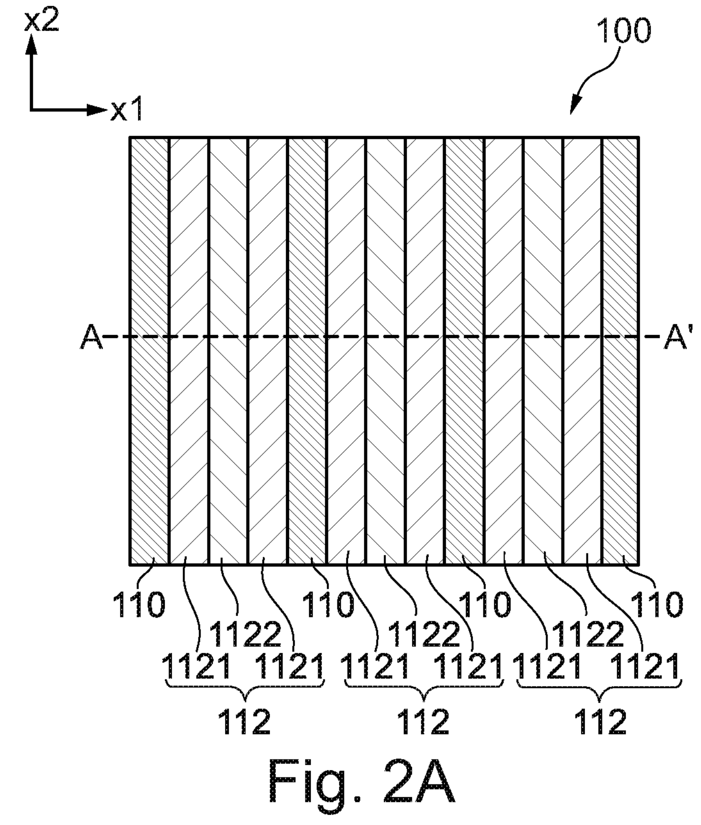

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a semiconductor device may include a drift region of a first conductivity type arranged between a first surface and a second surface of a semiconductor body. The semiconductor device may further include a first region of the first conductivity type at the second surface. The semiconductor device may further include a second region of a second conductivity type that is arranged adjacent to the first region at the second surface. The second region may include a first sub-region and a second sub-region. The second sub-region may be arranged between the first sub-region and the second surface. The semiconductor device may further include a first electrode on the second surface. The first electrode may be arranged directly adjacent to the first region and the second sub-region. The first electrode may be electrically connected to the drift region by means of the first region. The first sub-region may protrude, along a first lateral direction, across an interface or a separation region between the second sub-region and the first region. A part of the first region may be confined by the first sub-region and the first electrode along a vertical direction.

The semiconductor device may be an integrated circuit, or a discrete semiconductor device or a semiconductor module, for example. The semiconductor device may be or include a power semiconductor device, e.g. a vertical power semiconductor device having a load current flow between the first surface and the second surface. The semiconductor device may be or may include a power semiconductor reverse conducting insulated gate bipolar transistor (RC-IGBT) or a power semiconductor diode. The power semiconductor device may be configured to conduct currents of more than 1 A or more than 10 A or even more than 30 A, and may be further configured to block voltages between load terminals, e.g. between emitter and collector of an RC-IGBT, or between cathode and anode of a diode in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be or may include a magnetic Czochralski, MCZ, or a float zone (FZ) or an epitaxially deposited silicon semiconductor body.

The first surface may be a front surface or a top surface of the semiconductor device, and the second surface may be a back surface or a rear surface of the semiconductor device, for example. The semiconductor body may be attached to a lead frame via the second surface, for example. Over the first surface of the semiconductor body, bond pads may be arranged and bond wires may be bonded on the bond pads.

For example, in the drift region between the first surface and the second surface, an impurity or doping concentration may gradually or in steps increase or decrease with increasing distance to the first surface at least in portions of its vertical extension. According to other examples the impurity concentration in the drift region may be approximately uniform. For RC-IGBTs or diodes based on silicon, a mean impurity concentration in the drift region may be between $5\times10^{12}$ cm$^{-3}$ and $1\times10^{15}$ cm$^{-3}$, for example in a range from $1\times10^{13}$ cm$^{-3}$ to $2\times10^{14}$ cm$^{-3}$. In the case of a semiconductor device based on SiC, a mean impurity concentration in the drift region may be between $5\times10^{14}$ cm$^{-3}$ and $1\times10^{17}$ cm$^{-3}$, for example in a range from $1\times10^{15}$ cm$^{-3}$ to $2\times10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at the second surface of the semiconductor body.

The first region may be a cathode region of a diode or may be a collector region or rear side emitter region of a RC-IGBT, for example. For example, the first region and the drift region, or the first region, the field stop region and the drift region may form a continuous region of the first conductivity type.

The first electrode at the second surface may be a first load terminal L1, e.g. a collector terminal of an RC-IGBT or a cathode terminal of a diode, and may include or consist of a conductive material or a combination of conductive materials, for example a doped semiconductor material (e.g., a degenerate doped semiconductor material) such as doped polycrystalline silicon, metal or metal compound, for example. The first load terminal L1 may also include a combination of these materials, e.g. a liner or adhesion material and an electrode material. Exemplary contact or electrode materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example.

The second sub-region of the second region may interrupt the cathode region or collector region at the second surface. Similar to the cathode region or collector region at the second surface, the second sub-region may also directly contact the first electrode at the second surface. The second sub-region may allow for improving softness by building up of a temporary carrier plasma during reverse recovery by temporary injection of charge carriers. As a result of the electrical connection of the first sub-region to the first electrode via the second sub-region, the first sub-region may allow for further improving the softness by contributing to this temporary carrier plasma during reverse recovery by temporary injection of charge carriers. The charge carriers of this temporary carrier plasma may prevent a snap-off, for example. Design of the second sub-region, e.g. doping profile, geometry, or dimensions, may be adjusted with respect to operation conditions, for example.

The first sub-region of the second region is at least partly arranged between the first region and the drift region. Operating conditions, e.g. high voltages during snap-off, may drive a pn junction between the first sub-region and the first region into avalanche breakdown associated with charge carriers damping oscillations and overvoltage. Since there is no additional plasma to be removed, the first sub-region does not come at the cost of additional losses, e.g. switching losses.

By forming second regions including first and second sub-regions turning into one another, above technical benefits may be combined for improving a semiconductor device by enabling sufficient softness during switching without increasing the chip thickness and without sacrificing breakdown voltage or cosmic ray performance. By forming second regions including first and second sub-regions turning into one another, the effective size of the second sub-regions and their temporary injection of charge carriers during reverse recovery is enlarged. At the same time, the effective size of the first sub-regions and their softness damping capability by avalanche generation is maintained. Also, the size of the cathode region (or first region) is not affected compared to a structure with second sub-regions only. Thus, a very high efficiency of usage of the available backside area both for conduction and softness measures can be achieved. Furthermore, an additional degree of freedom for tuning the tradeoff of static and dynamic losses is introduced.

For example, the semiconductor device may further include a field stop region of the first conductivity type arranged between the drift region and the second region. The field stop region may be non-patterned, e.g. may be continuous without any openings, with respect to an active area of the semiconductor device, or with respect to an area at the second surface that is covered by the first and second regions. In some examples, the field stop region may be patterned and may fully or partly cover the first region. The field stop region may also be patterned and may fully or partly cover the second region. For example, the field stop region may be patterned and may fully cover the second region and may partly or fully cover the first region.

For example, the semiconductor device may include a diode including an anode region and a cathode region. The anode region or the cathode region may be arranged between the first surface and the drift region and may form a pn-junction with the drift region. For example, the anode region may be a continuous region directly adjoining the first surface or may include a plurality anode sub-regions laterally spaced from one another. The anode sub-regions may be laterally separated by trenches, for example. The trenches may include a trench electrode structure comprising a trench dielectric and a trench electrode, for example. By switching conductivity types of doped regions, the anode may be either arranged at a front or rear surface of the semiconductor body. Likewise, the cathode may be either arranged at a rear or front surface of the semiconductor body.

For example, the semiconductor device may include a transistor. The transistor may include a body region. The body region may be arranged between the first surface and the drift region and may form a pn-junction with the drift region. The pn-junction may be closer to the first surface than the second surface, for example. For RC-IGBTs, the semiconductor device may include an IGBT in a first area and a diode in a second area, wherein the second region or sub-regions thereof may be included in the diode, and may partly or fully be surrounded by the first area, for example.

For example, the second sub-region may be stripe-shaped and may extend along a second lateral direction. The second sub-region may also have a polygonal, circular, annular, or elliptic shape. The first lateral direction and the second lateral direction extend along different lateral directions. For example, the first lateral direction may be perpendicular to the second lateral direction. In some examples, the second sub-region may be grid-shaped, wherein the first region may be arranged in openings of the grid. In some other examples, the first region may be grid-shaped, wherein the second sub-region may be arranged in openings of the grid. A shape of the second sub-region may be defined by a shape of a surface area covered by a vertical projection of the second sub-region onto the second surface. Likewise, a shape of the first sub-region (or the first region) may be defined by a shape of a surface area covered by a vertical projection of the first sub-region (or the first region) onto the second surface.

For example, the first sub-region may be stripe-shaped. In an embodiment, the first sub-region may be stripe-shaped extending along a first lateral direction other than the second lateral direction. In another embodiment, the first sub-region may be stripe-shaped extending along the second lateral direction. Alternatively, the first sub-region may have a polygonal, circular, annular, elliptic shape or grid shape.

For example, a value of a ratio of an area of the first sub-region to the second sub-region may be at least 1.5, at least 4, or at least 10. For example, the ratio may be smaller than 100, or smaller than 50, or even smaller than 10. An area of the first sub-region may be defined by a surface area covered by a vertical projection of the first sub-region onto the second surface. Likewise, an area of the second sub-region may correspond to a surface area covered by a vertical projection the second sub-region onto the second surface. For example, a maximum lateral extent of the first sub-region, e.g. a diameter of a circular-shaped first sub-region, may range from 10 μm to 700 μm, or from 50 μm to 500 μm, for example. Alternatively or additionally, the maximum lateral extent of the first sub-region may range from 0.3×d to 3×d, d being a thickness of the semiconductor body, e.g. a vertical distance between the first surface and the second surface.

For example, a bottom surface of the first sub-region may completely overlap an interface between the second region and the first electrode. For example, a top surface of the second sub-region may fully adjoin to a bottom surface of the first sub-region. For example, an interface between the top surface of the second sub-region and the bottom surface of the first sub-region may be equal to or close to a vertical level where the first sub-region protrudes, along the first lateral direction, over an interface or separation region between the second sub-region and the first region.

For example, a bottom surface of the first sub-region may overlap only a first part of an interface between the second region and the first electrode. With respect to a second or remaining part of an interface between the second region and the first electrode, a top surface of the second sub-region may directly adjoin to the drift region or to a field stop region, for example.

For example, a dose of dopants of the second conductivity type in the first sub-region may range from $5\times10^{12}$ cm$^{-2}$ to $5\times10^{14}$ cm$^{-2}$. A dose of dopants of a doped semiconductor region may be defined by an integral number of dopants per unit surface area. For example, the integral dose of dopants of a doped semiconductor region may be determined by integrating a concentration of dopants along a vertical extent of the semiconductor region, e.g. between a bottom surface of the semiconductor region to the top surface of the semiconductor region. For example, a concentration of dopants of the second conductivity type in the first sub-region may range from $5\times10^{16}$ cm$^{-3}$ to $1\times10^{19}$ cm$^{-3}$. For example, the vertical extent of the first sub-region may range between i) a pn junction between the first sub-region and the drift or field stop region and ii) a transition between the top surface of the second sub-region and the bottom surface of the first sub-region that may be equal to or close to a vertical level where the first sub-region protrudes, along the first lateral direction, over an interface between the second sub-region and the first region. The transition between the top surface of the second sub-region and the bottom surface of the first sub-region that may also correspond to a vertical level where an overlap of doping concentration profiles of the first sub-region and the second sub-region has a minimum value. For example, the dose of dopants may be determined by characterization techniques, e.g. by Secondary Ion Mass Spectrometry (SIMS), Spreading Resistance Analysis (SRA), Stripping Hall (SH) and Electrochemical Capacitance Voltage (ECV).

The dose of dopants and/or a concentration of dopants of the first sub-region may be adjusted to optimize the injection properties of the first sub-region regarding the temporary carrier plasma during reverse recovery. The doping concentration of each the first and the second sub-region can be optimized independently. A dose of dopants and/or a concentration of dopants of the second sub-region may be adjusted to the electric properties of the contact between the second region or, respectively, the second sub-region and the first electrode. For example, the dose of dopants of the second conductivity type in the second sub-region may range from $1\times10^{13}$ cm$^{-2}$ to $5\times10^{15}$ cm$^{-2}$. For example, a concentration of dopants of the second conductivity type in the second sub-region may range from $1\times10^{12}$ cm$^{-3}$ to $1\times10^{20}$ cm$^{-3}$.

The above-mentioned values for the dose and the concentration of the dopants in the first sub-region and/or the second sub-region may, for example, refer to an electrically activated dopant dose and/or an electrically activated dopant concentration. The term "electrically activated dopant concentration" refers to a dopant concentration that provides and/or increases the electric conductivity. For example, the term "electrically activated the dopant concentration" does not refer to a damage concentration. For example, an electric conductivity, e.g., the sheet electric conductivity, is substantially proportional to the electrically activated dopant concentration (at a given temperature).

For example, in a vertical cross-section, the semiconductor device may include a plurality of second regions including the second region. The second regions may be laterally spaced from one another. In a region separating the plurality of second regions, the first regions may adjoin the field stop region or may adjoin the drift region, for example.

For example, at least some of the second regions may be arranged in a regular pattern. For example, the second regions may be arranged in a two-dimensional array. The second regions may also be arranged as parallel stripes, for example.

For example, at least some of the second regions differ in lateral dimensions. For example, at least some of the second regions may have a circular shape, wherein a diameter may differ between some or all of the circular-shaped second regions. In addition or as an alternative, at least some of the second regions may be stripe-shaped, wherein a width of the stripes may differ between some or all of the stripe-shaped second regions. The second regions may not only include regions of similar shape, e.g. circular or stripe-shape, and different lateral dimensions, but may in addition or as an alternative include regions that differ in shape and size. In an example, the regions of similar shape may exhibit different lateral dimensions but with different pitch, the pitch being a lattice constant according to which the first regions and/or second regions are arranged on the second surface.

For example, a coverage ratio or lateral dimensions of the second regions with respect to the second surface may differ between surface area parts at the second surface. This may allow for setting up areas with varying or slightly different electric characteristic, e.g. softness, that may allow for an improved tuning of the semiconductor device to the application's needs.

For example, the first region may be a continuous region laterally surrounding at least some of the second regions. For example, the first region may form a grid and second regions may be arranged in openings of the grid.

Functional or structural details described above with respect to features of the semiconductor device shall likewise apply to corresponding features of the method described below.

A method of manufacturing a semiconductor device may include providing a semiconductor body including a drift region of a first conductivity type arranged between a first surface and a second surface of the semiconductor body. The method may further include forming a first region of the first conductivity type at the second surface. The method may further include forming a second region of a second conductivity type that is arranged adjacent to the first region at the second surface. The second region may include a first sub-region and a second sub-region. The second sub-region may be arranged between the first sub-region and the second surface. The first sub-region may be arranged protruding, along a first lateral direction, over an interface or separation region between the second sub-region and the first region. The method may further include forming a first electrode on the second surface. The electrode may be arranged directly adjacent to the first region and the second sub-region. The first electrode may be electrically connected to the drift region by means of the first region. A part of the first region may be confined by the first sub-region and the first electrode along a vertical direction.

For example, forming the second region may include at least two ion implantation processes having different ion implantation energy. One of the at least two ion implantation processes may be an unmasked ion implantation process. For example, an unmasked ion implantation process may be an implantation process where the dopants are introduced through a total front or rear surface of the semiconductor body without surface areas being masked. In other words, an unmasked ion implantation process lacks an implantation mask for preventing the dopants from entering the semiconductor body in the masked areas. For example, the unmasked ion implantation process may be used to form the second sub-region, for example. For example, the masked ion implantation process may be used to form the first sub-region, for example.

For example, forming the second region may include two masked ion implantation processes. Forming the first region may include one ion implantation process. The one ion implantation process for forming the first region may be a masked or unmasked ion implantation process. For the masked ion implantation process for forming the first region, a dose or a maximum doping concentration associated with the ion implantation process may be larger or smaller than a dose or a maximum doping concentration associated with the ion implantation process for forming the second region. For an unmasked ion implantation process for forming the first region, a dose or a maximum doping concentration associated with the ion implantation process may be smaller than a dose or a maximum doping concentration associated with the ion implantation process for forming the second region. Thus, the dopants for the first region only partially compensate dopants for the second region. The second region may be formed by different dopant species, e.g. boron and indium for p-doping in silicon. When using different dopant species for the second region, ion implantation energies may be adjusted to achieve different implantation depths into the semiconductor body, for example.

For example, forming the second region may include one masked ion implantation process. The first region may be formed by a masked ion implantation process. Dopants of the second region may extend deeper into the semiconductor body than dopants of the first region. In an overlap region where dopants of the first region and dopants of the second region are implanted, the dopants of the first region may outnumber the dopants of the second region and define the conductivity type of the overlap region.

For example, the method may further include a laser annealing process configured to melt at least a part of the second sub-region. Optionally, the laser annealing process may also be configured to melt at least a part of the first region, activating both, the first region and the second sub-region in one single step. The laser annealing process may be configured to electrically activate dopants of the second sub-region introduced by an ion implantation process, for example.

In an embodiment, the laser annealing process may be configured to melt only the second sub-region and the first region. In other words, the laser annealing process may be configured not to melt the first sub-region. The laser annealing process may be configured to electrically activate dopants of the second sub-region introduced by an ion implantation process, for example. Dopants of the first sub-region introduced by an ion implantation process may be partly activated by thermal conduction of heat introduced into the second sub-region by the laser annealing process.

For example, the method may include a further laser annealing process configured to melt at least a part of the first sub-region. The further laser annealing process may be carried out before implantation of the dopants forming the first region and before the laser annealing process. In other words, the first region may be formed after the further laser annealing process. The further laser annealing process may melt deeper regions of the semiconductor material than the laser annealing process. In other words, laser annealing process may have a smaller depth of penetration when compared to the further laser annealing process. In addition to the laser annealing process and/or the further laser annealing process, thermal annealing or rapid thermal annealing may be carried out for electrically activating the dopants.

The examples and features described above and below may be combined.

Functional and structural details described with respect to the examples above shall likewise apply to the exemplary examples illustrated in the figures and described further below.

In the following, further examples of semiconductor devices are explained in connection with the accompanying drawings. Functional and structural details described with respect to the examples above shall likewise apply to the exemplary embodiments illustrated in the figures and described further below. The conductivity type of the illustrated semiconductor regions may also be reversed, i.e. n-type being p-type and p-type being n-type.

FIG. 1A schematically and exemplarily shows a section of a cross-sectional view of a semiconductor device 100.

The semiconductor device 100 includes an $n^-$-doped drift region 102 arranged between a first surface 104 and a second surface 106 of a semiconductor body 108. An $n^+$-doped first region 110, e.g. a cathode region, adjoins to the second surface 106. The semiconductor device 100 further includes a $p^+$-doped second region 112 that is arranged adjacent to the first region 110 at the second surface 106. The second region 112 includes a first sub-region 1121 and a second sub-region 1122. The second sub-region 1122 is arranged between the first sub-region 1121 and the second surface 106.

The semiconductor device 100 further includes a first electrode 114 on the second surface 106. The first electrode 114 is arranged directly adjacent to the first region 110 and the second sub-region 1122. The first electrode 114 may be a first load terminal, e.g. a cathode terminal, at a rear or back side of the semiconductor device 100. For example, the first electrode 114 may be arranged on a chip carrier, e.g. a lead frame. The semiconductor device further includes a p-doped region 118, e.g. an anode region, adjoining to a second electrode 120 at the first surface 104. The p-doped region 118 is arranged between the first surface 104 and the drift region 102 and forms a pn-junction 119 with the drift region 102. The second electrode 120 may be a second load terminal, e.g. an anode terminal, at a front or top side of the semiconductor device 100. The second electrode 120 may include or consist of a conductive material or a combination of conductive materials. The second electrode 120 may constitute or be part of a wiring area formed over the semiconductor body 108. The wiring area may include one, two, three or even more wiring levels that may include patterned or non-patterned metal layers and interlayer dielectrics arranged between the patterned or non-patterned metal layers. Vias may electrically interconnect the different wiring levels, for example.

The first sub-region 1121 protrudes, along a first lateral direction x1, over an interface 115 between the second sub-region 1122 and the first region 110. The interface 115 may be a pn-junction laterally separating the second sub-region 1122 and the first region 110, for example. A part 122 of the first region 110 is confined by the first sub-region 1121 and the first electrode 114 along a vertical direction y.

An n-doped field stop region 116 is arranged between the drift region 102 and the second region 112 as well as between the drift region 102 and the first region 110. The first electrode 114 is electrically connected to the drift region 102 by means of the first region 110 and the field stop region 116. The first region 110, the field region 116 and the drift region 102 turn into one another and form a continuous n-doped region that is electrically connected to the first electrode 114 at the second surface 106.

The schematic cross-sectional view of FIG. 1A illustrates a portion of the semiconductor device 100. The schematic cross-sectional views of FIGS. 1B to 1D illustrate different designs of the second region in an area S of FIG. 1A.

The examples of FIGS. 1B to 1D differ in an overlap between a top surface of the second sub-region 1122 and a bottom surface of the first sub-region 1121. While in all of the examples illustrated in FIGS. 1A to 1D, the first sub-region 1121 protrudes, along the first lateral direction x1, over an interface 115 between the second sub-region 1122 and the first region 110, the transition between the first sub-region 1121 and the sub-region 1122 differs at a second interface 1152 that is opposite to the interface 115 along the first lateral direction x1. In the example illustrated in FIG. 1B, the first sub-region 1121 also protrudes over the second interface 116. In the example illustrated in FIG. 1C, a lateral face of the first sub-region 1121 neither protrudes over the second interface 116 nor ends before the second interface 1152, but coincides with the second interface 1152. In the example illustrated in FIG. 1D, a lateral face of the first sub-region 1121 ends before the second interface 1152.

Thus, in the example illustrated in FIGS. 1B, 1C, a bottom surface of the first sub-region 1121 completely covers an interface between the second region 112 and the first electrode 114. In the example illustrated in FIG. 1D, a bottom surface of the first sub-region 1121 covers only a first part of an interface between the second region 112 and the first electrode 114. With respect to a second or remaining part of an interface between the second region 112 and the first electrode 114 of the example illustrated in FIG. 1D, a top surface of the second sub-region 1122 directly adjoins to the field stop region 116.

Figure 2B:
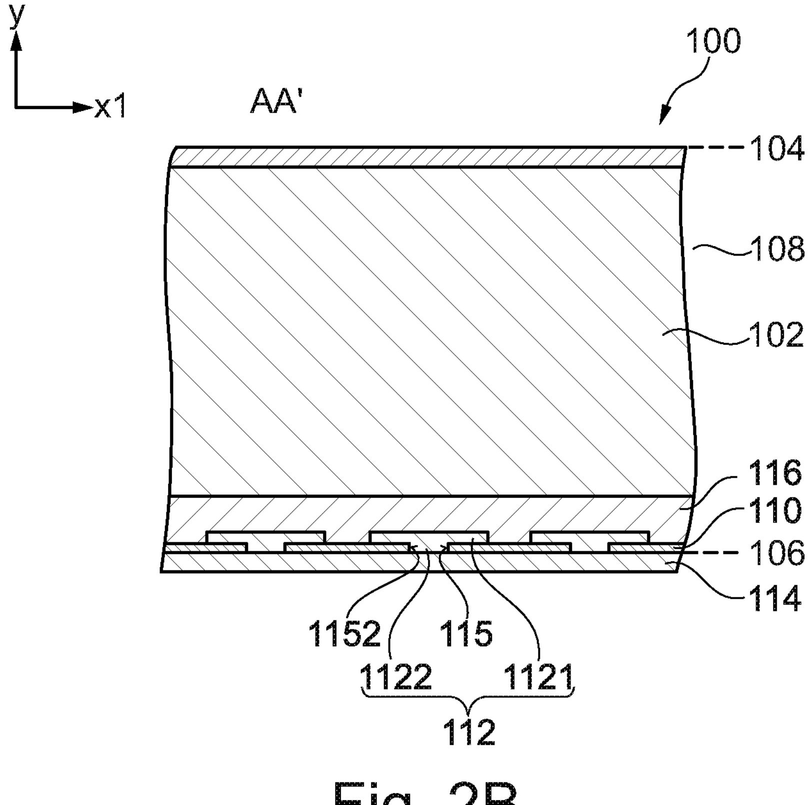

The schematic top view of FIG. 2A and the schematic cross-sectional view of FIG. 2B illustrate an example of a semiconductor device 100 including a plurality of second regions 112 that are based on the design illustrated in FIG. 1B. In the example of FIGS. 2A and 2B, the first sub-region 1121 protrudes over the interface 115 along the first lateral direction x1 and also protrudes over the second interface 1152 along the opposite lateral direction.

In the example of FIGS. 2A, 2B, the first sub-regions 1121, the second sub-regions 1122 and the first regions 110 are stripe-shaped and extend along a second lateral direction x2 parallel to one another. In the illustrated example, the second lateral direction x2 is perpendicular to the first lateral direction x1.

The schematic top view of FIG. 3A and the schematic cross-sectional view of FIG. 3B illustrate an example of a semiconductor device 100 including a plurality of second regions 112 that are based on the design illustrated in FIG. 1B. In the example of FIGS. 3A and 3B, the first sub-region 1121 protrudes over the interface 115 along the first lateral direction x1 and also protrudes over the second interface 1152 along the opposite lateral direction.

In the example of FIGS. 3A, 3B the first sub-regions 1121, and the second sub-regions 1122 have a circular shape. Centers of the circular shape of each pair of first and second sub-regions 1121, 1122 coincide.

The example of a semiconductor device 100 illustrated in the schematic top view of FIG. 4A and the schematic cross-sectional views of FIGS. 4B, 4C differs from the example illustrated in FIGS. 3A, 3B in that centers of the circular shape of each pair of first and second sub-regions 1121, 1122 are staggered by an offset Δ1. The offset Δ1 and diameters of the first and second sub-regions 1121, 1122 may be varied among the second regions 112, for example.

Figures 5A, 5B, 5C, 6A, 6B, 6C:
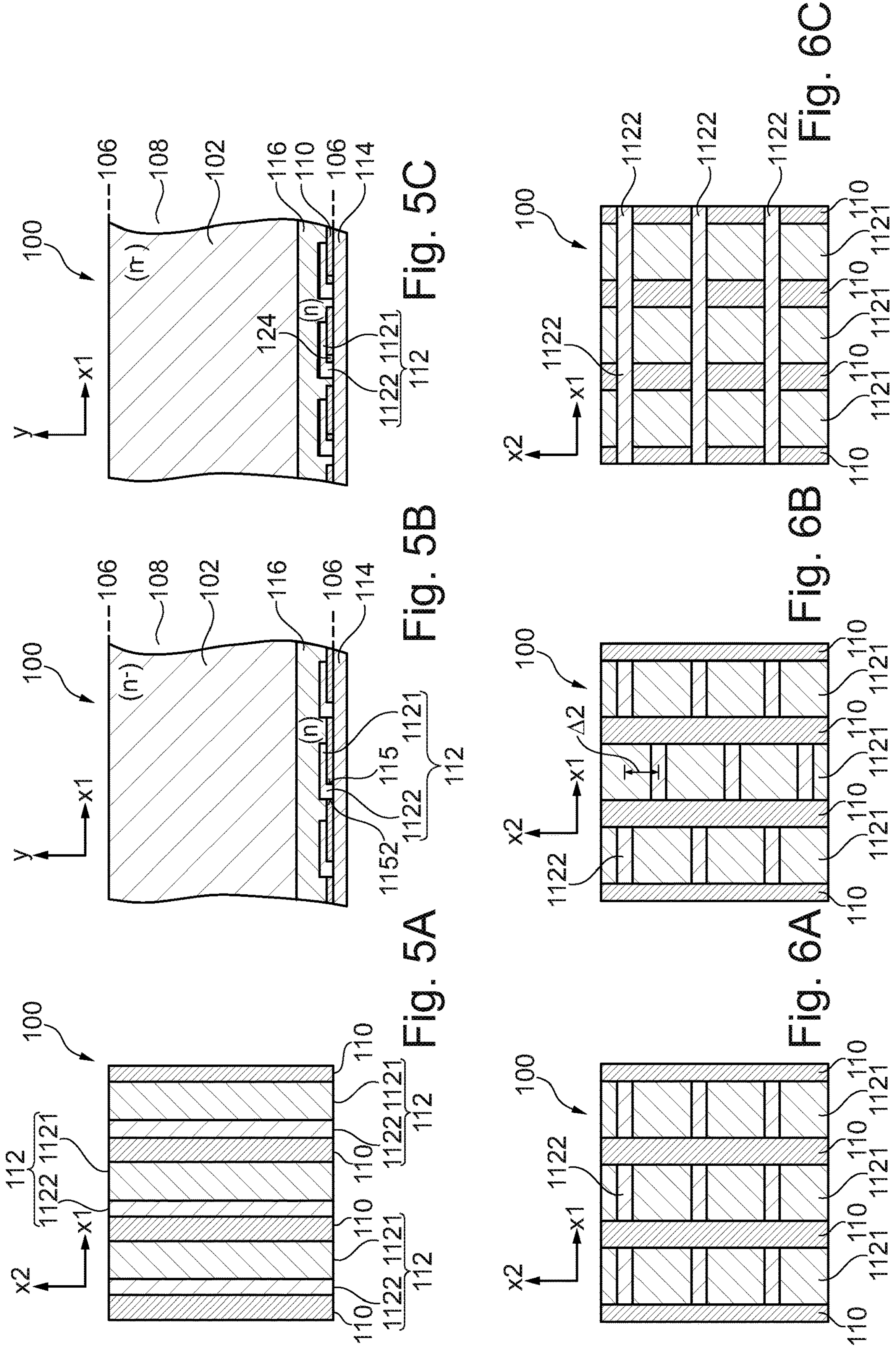

The schematic top view of FIG. 5A and the schematic cross-sectional view of FIG. 5B illustrate an example of a semiconductor device 100 including a plurality of second regions 112 that are based on the design illustrated in FIG. 1C.

The schematic top view of FIG. 5A and the schematic cross-sectional view of FIG. 5C illustrate an example of a semiconductor device 100 including a plurality of second regions 112 that are based on the design illustrated in FIG. 1C. In the example of FIG. 5C, the second sub-regions 1122 and the first regions 110 are laterally spaced from one another by a separation region 124.

The schematic top views of FIGS. 6A to 6C illustrate examples of a semiconductor device 100 including a plurality of second regions 112. The first sub-regions 1121 and the first regions 110 are stripe shaped and extend in parallel along the second lateral direction x2. The second sub-regions 1122 are formed in the shape of parallel stripes extending along the first lateral direction x1 (see FIG. 6C), or are formed as parallel stripe-segments (see FIG. 6A) extending along the first lateral direction x1, or are formed as parallel stripe-segments (see FIG. 6C) extending along the first lateral direction x1, wherein subsequent stripe segments are offset along the second lateral x2 by an offset Δ2. In the examples of FIG. 6A to 6C, alignment of the first and second sub-regions 1121, 1122 may be simplified with respect to alignment requirements of the examples as illustrated in FIGS. 3A, 3B, 4A, 4B, for example.

Figure 7A:
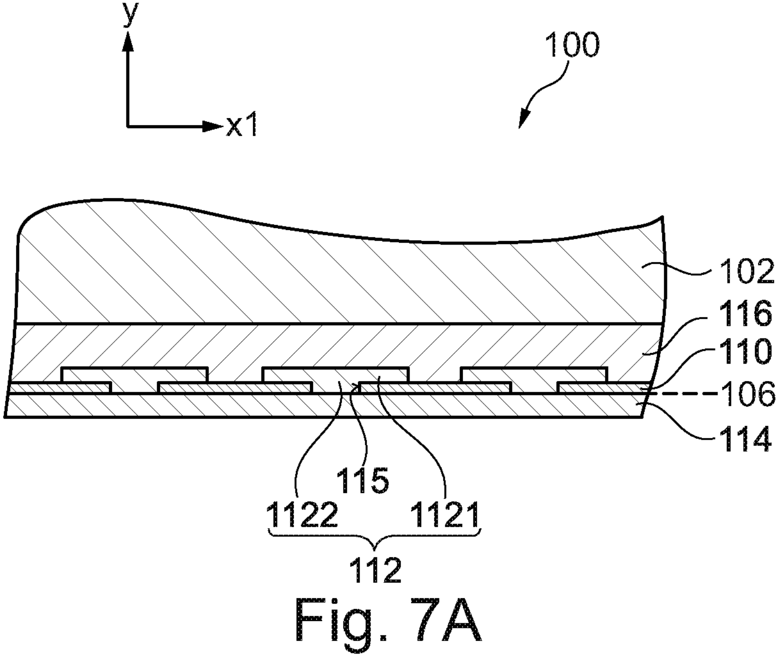
Figure 7B:
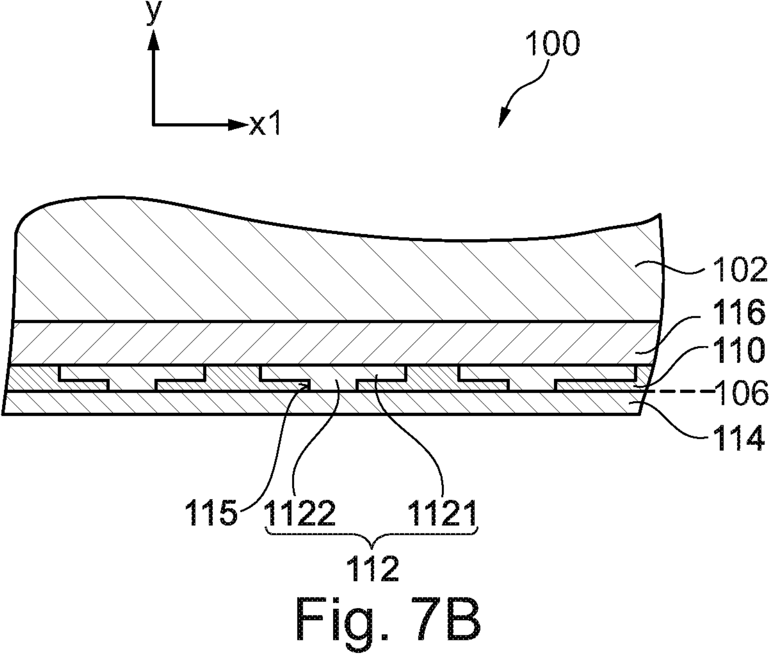

The schematic top views of FIGS. 7A and 7B illustrate examples of a semiconductor device 100 including a plurality of second regions 112 that are based on the design illustrated in FIG. 1B. The examples illustrated in FIGS. 7A and 7B differ with respect to a vertical extent of the first region 110. In the example of FIG. 7A, the first region 110 extends to a depth that is equal to or close to a depth of the second sub-region 1122. In the example of FIG. 7B, the first region 110 extends to a depth that is equal to or close to a depth of the first sub-region 1121. However, a relation of the respective depth of the first region 110 and the second region 112 is arbitrary. The first region 110 may have a similar depth, a smaller depth or a larger depth than the second region 112. Also, a relation of the respective depth of the first region 110 and the second sub-region 1122 is arbitrary. The first region 110 may have a similar depth, a smaller depth or a larger depth than the second sub-region 1122. According to an embodiment, the depth or thickness of the first region may vary laterally. The first region 110 may, for example, exhibit a first thickness and/or a first depth where the first region 110 laterally overlaps the first sub-region 1121 and a second thickness and/or a second depth where the first region 110 comprises no lateral overlap with the first sub-region 1121. The second depth and/or second thickness may be different from the first thickness and/or first depth. The second depth and/or second thickness may, for example, be larger than the first thickness and/or first depth.

The schematic top views of FIGS. 8A to 8D illustrate examples of a semiconductor device 100 including a grid-shaped first region or a grid-shaped second region. In the schematic top views of FIGS. 8A, 8B, and 8D, the first region 110 is grid-shaped and continuous, and laterally surrounds the second sub-regions 1122. The first sub-region 1121 is arranged over the second sub-region 1122, and over a part of the first region 110. In the schematic top view of FIG. 8C, the second sub-region 1122 is grid-shaped and continuous, and laterally surrounds the first regions 110. The first sub-region 1121 is arranged over the second sub-region 1122, and over a part of the first regions 110.

The examples illustrated in the figures may be combined and may further be combined with other designs of the second region 112 not illustrated in the figures but disclosed as an example herein. By using different designs of the second region 112, e.g. geometry, dose of doping, lateral and vertical extent, in different applications, softness of the diode may be improved and, at the same time, a wide area in the diode tradeoff can be accessed for tuning a power diode to the applications' need.

The aspects and features mentioned and described together with one or more of the previously described examples and figures, may as well be combined with one or more of the other examples in order to replace a corresponding feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a drift region of a first conductivity type arranged between a first surface and a second surface of a semiconductor body;

a first region of the first conductivity type at the second surface;

a second region of a second conductivity type that is arranged adjacent to the first region at the second surface, wherein the second region includes a first sub-region and a second sub-region, the second sub-region being arranged between the first sub-region and the second surface; and a first electrode on the second surface, wherein the first electrode is arranged directly adjacent to the first region and the second sub-region, and the first electrode is electrically connected to the drift region by the first region, wherein the first sub-region protrudes, along a first lateral direction, over an interface or separation region between the second sub-region and the first region, wherein a part of the first region is confined by the first sub-region and the first electrode along a vertical direction, wherein along the first lateral direction, a vertical arrangement of the second region and the first region varies as follows:

over a first lateral span, the first region is present but not the second region;

over a second lateral span, the first sub-region and the second sub-region of the second region are present but not the first region; and over a third lateral span interposed between the first lateral span and the second lateral span, the first sub-region of the second region and the first region are present but not the second sub-region of the second region.

2. The semiconductor device of claim 1, further comprising a field stop region of the first conductivity type, wherein the field stop region is arranged between the drift region and the second region.

3. The semiconductor device of claim 1, further comprising a diode including an anode region and a cathode region, wherein the anode region or the cathode region is arranged between the first surface and the drift region and forms a pn-junction with the drift region.

4. The semiconductor device of claim 1, further comprising a transistor body region, wherein the transistor body region is arranged between the first surface and the drift region and forms a pn-junction with the drift region.

5. The semiconductor device of claim 1, wherein the second sub-region is stripe-shaped and extends along a second lateral direction, or has a polygonal, circular, annular, or elliptic shape.

6. The semiconductor device of claim 5, wherein the first sub-region is stripe-shaped extending along a third lateral direction other than the second lateral direction.

7. The semiconductor device of claim 1, wherein a value of a ratio of an area of the first sub-region to the second sub-region is at least 1.5.

8. The semiconductor device of claim 1, wherein a bottom surface of the first sub-region completely covers an interface between the second region and the first electrode.

9. The semiconductor device of claim 1, wherein a bottom surface of the first sub-region covers only a first part of an interface between the second region and the first electrode.

10. The semiconductor device of claim 1, wherein a dose of dopants of the second conductivity type in the first sub-region ranges from $5\times10^{12}$ $cm^{-2}$ to $5\times10^{14}$ $cm^{-2}$.

11. The semiconductor device of claim 1, further comprising, in a vertical cross-section, a plurality of second regions comprising the second region, wherein the second regions are laterally spaced from one another.

12. The semiconductor device of claim 11, wherein at least some of the second regions are arranged in a regular pattern.

13. The semiconductor device of claim 11, wherein at least some of the second regions differ in lateral dimensions.

14. The semiconductor device of claim 11, wherein a coverage rate or lateral dimensions of the second regions with respect to the second surface differs between surface area parts at the second surface.

15. The semiconductor device of claim 11, wherein the first region is a continuous region laterally surrounding at least some of the second regions.

16. The semiconductor device of claim 1, wherein along the first lateral direction, the first sub-region of the second region completely covers the second sub-region of the second region over the second lateral span.

17. A method of manufacturing a semiconductor device, the method comprising:

providing a semiconductor body including a drift region of a first conductivity type arranged between a first surface and a second surface of the semiconductor body;

forming a first region of the first conductivity type at the second surface;

forming a second region of a second conductivity type that is arranged adjacent to the first region at the second surface, wherein the second region includes a first sub-region and a second sub-region, the second sub-region being arranged between the first sub-region and the second surface, the first sub-region being arranged protruding, along a first lateral direction, over an interface or separation region between the second sub-region and the first region; and forming a first electrode on the second surface, wherein the first electrode is arranged directly adjacent to the first region and the second sub-region, and the first electrode is electrically connected to the drift region by the first region, wherein a part of the first region is confined by the first sub-region and the first electrode along a vertical direction, wherein along the first lateral direction, a vertical arrangement of the second region and the first region varies as follows:

over a first lateral span, the first region is present but not the second region;

over a second lateral span, the first sub-region and the second sub-region of the second region are present but not the first region; and over a third lateral span interposed between the first lateral span and the second lateral span, the first sub-region of the second region and the first region are present but not the second sub-region of the second region.

18. The method of claim 17, wherein forming the second region comprises at least two ion implantation processes having different ion implantation energy, wherein one of the at least two ion implantation processes is an unmasked ion implantation process.

19. The method of claim 17, wherein forming the second region comprises two masked ion implantation processes, and wherein forming the first region comprises one ion implantation process.

20. The method of claim 17, wherein forming the second region comprises only one masked ion implantation process.

21. The method of claim 17, further comprising a laser annealing process configured to melt at least a part of the second sub-region.

22. The method of claim 21, further comprising a further laser annealing process configured to melt at least a part of the first sub-region, wherein the further laser annealing process is carried out before implanting the dopants forming the first region.

23. The method of claim 17, wherein along the first lateral direction, the first sub-region of the second region completely covers the second sub-region of the second region over the second lateral span.

* * * * *